(12) United States Patent
Tran

(10) Patent No.: US 7,300,839 B2
(45) Date of Patent: Nov. 27, 2007

(54) SELECTIVE POLYSILICON STUD GROWTH

(75) Inventor: Luan Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 10/612,333

(22) Filed: Jul. 2, 2003

(65) Prior Publication Data

US 2004/0038476 A1 Feb. 26, 2004

Related U.S. Application Data

(62) Division of application No. 10/056,183, filed on Jan. 24, 2002, now Pat. No. 6,660,584, which is a division of application No. 09/653,638, filed on Aug. 31, 2000, now Pat. No. 6,380,576.

(51) Int. Cl.
*H01L 21/00* (2006.01)
(52) U.S. Cl. .................. 438/238; 438/253; 438/243
(58) Field of Classification Search ................ 438/238, 438/253, 243
See application file for complete search history.

(56) References Cited

U.S. PATENT DOCUMENTS

| | | | |
|---|---|---|---|
| 4,541,169 A | 9/1985 | Bartush | |
| 5,144,579 A | 9/1992 | Okabe et al. | |
| 5,145,802 A | 9/1992 | Tyson et al. | |
| 5,248,628 A | 9/1993 | Okabe et al. | |
| 5,296,400 A | 3/1994 | Park et al. | |
| 5,302,844 A | 4/1994 | Mizuno et al. | |
| 5,326,722 A | 7/1994 | Huang | |
| 5,341,326 A | 8/1994 | Takase et al. | |
| 5,401,681 A | 3/1995 | Dennison | |
| 5,525,820 A | 6/1996 | Furuyama | |
| 5,545,585 A | 8/1996 | Wang et al. | |
| 5,587,338 A | 12/1996 | Tseng | |
| 5,665,623 A | 9/1997 | Liang et al. | |
| 5,670,404 A | 9/1997 | Dai | |
| 5,747,844 A | 5/1998 | Aoki et al. | |
| 5,780,343 A | 7/1998 | Bashir | |

(Continued)

FOREIGN PATENT DOCUMENTS

KR 2001008604 2/2001

OTHER PUBLICATIONS

Koga et al., A 0.23 um2 Double Self-Aligned Contact Cell for Gigabit DRAMs With a Ge-Added Vertical Epitaxial Si Pad, 1996 IEEE, IEDM 96-589—IEDM 96-592.

(Continued)

*Primary Examiner*—Laura M. Schillinger
(74) *Attorney, Agent, or Firm*—Dinsmore & Shohl LLP

(57) ABSTRACT

A memory cell having a bit line contact is provided. The memory cell may be a $6F^2$ memory cell. The bit line contact may have a contact hole bounded by insulating sidewalls, and the contact hole may be partially or completely filled with a doped polysilicon plug. The doped polysilicon plug may have an upper plug surface profile that is substantially free of concavities or substantially convex. Similarly, a storage node contact may comprise a doped polysilicon plug having an upper plug surface profile that is substantially free of concavities or that is substantially convex. Additionally, a semiconductor device having a conductive contact comprising a polysilicon plug may is provided. The plug may contact a capacitor structure.

5 Claims, 6 Drawing Sheets

U.S. PATENT DOCUMENTS

| | | | |
|---|---|---|---|
| 5,827,770 | A | 10/1998 | Rhodes et al. |
| 5,843,820 | A | 12/1998 | Lu |
| 5,901,092 | A | 5/1999 | Tran |
| 5,917,213 | A | 6/1999 | Iyer et al. |
| 5,943,581 | A | 8/1999 | Lu et al. |
| 5,955,757 | A | 9/1999 | Jen et al. |
| 5,994,182 | A | 11/1999 | Gonzalez et al. |
| 5,994,735 | A | 11/1999 | Maeda et al. |
| 6,025,221 | A | 2/2000 | Brown |
| 6,043,562 | A | 3/2000 | Keeth |
| 6,127,209 | A | 10/2000 | Maeda et al. |
| 6,136,643 | A | 10/2000 | Jeng et al. |
| 6,218,693 | B1 | 4/2001 | Lu |
| 6,255,160 | B1 | 7/2001 | Huang |
| 6,291,846 | B1 | 9/2001 | Ema et al. |
| 6,300,215 | B1 | 10/2001 | Shin |
| 6,329,241 | B1 | 12/2001 | Lin |
| 6,380,576 | B1* | 4/2002 | Tran .................. 257/296 |
| 6,380,578 | B1 | 4/2002 | Kunikiyo |
| 6,420,751 | B1 | 7/2002 | Maeda et al. |
| 6,429,529 | B1 | 8/2002 | Keeth |
| 6,501,116 | B2 | 12/2002 | Kisu et al. |
| 6,649,962 | B2* | 11/2003 | Tran .................. 257/296 |
| 6,653,230 | B2* | 11/2003 | Nakamura .............. 438/638 |
| 6,660,584 | B2* | 12/2003 | Tran .................. 438/256 |
| 6,671,242 | B1 | 12/2003 | Ootera |
| 6,787,411 | B2 | 9/2004 | Kisu et al. |
| 6,861,691 | B2* | 3/2005 | Tran .................. 257/296 |
| 6,882,006 | B2 | 4/2005 | Maeda et al. |
| 6,897,520 | B2 | 5/2005 | Vora |
| 6,974,990 | B2* | 12/2005 | Tran .................. 257/296 |
| 7,118,960 | B2* | 10/2006 | Tran .................. 438/256 |
| 7,224,019 | B2* | 5/2007 | Hieda et al. ............ 257/315 |
| 2002/0068387 | A1* | 6/2002 | Tran .................. 438/128 |
| 2002/0096703 | A1 | 7/2002 | Vora |
| 2002/0110977 | A1* | 8/2002 | Nakamura .............. 438/239 |
| 2002/0197787 | A1* | 12/2002 | Tran .................. 438/238 |
| 2003/0124465 | A1 | 7/2003 | Lee et al. |
| 2004/0037134 | A1* | 2/2004 | Tran .................. 365/202 |
| 2004/0038476 | A1* | 2/2004 | Tran .................. 438/238 |
| 2004/0147114 | A1 | 7/2004 | Park et al. |
| 2004/0188733 | A1 | 9/2004 | Asao et al. |
| 2005/0040450 | A1* | 2/2005 | Tran .................. 257/296 |
| 2005/0051832 | A1 | 3/2005 | Fukumura et al. |
| 2005/0064656 | A1* | 3/2005 | Tran .................. 438/232 |
| 2005/0124108 | A1* | 6/2005 | Tran .................. 438/238 |
| 2005/0202630 | A1* | 9/2005 | Tran .................. 438/253 |
| 2005/0226047 | A1* | 10/2005 | Hieda et al. .......... 365/185.14 |
| 2006/0105556 | A1 | 5/2006 | Matsui et al. |
| 2006/0278912 | A1* | 12/2006 | Tran .................. 257/296 |
| 2007/0004134 | A1 | 1/2007 | Vora |

OTHER PUBLICATIONS

Hada et al., A Self-Aligned Contact Technology Using Anisotropical Selective Epitaxial Silicon For Giga-Bit DRAMs, IEEE, 1995 IEDM 95-665—IEDM 95-668.

* cited by examiner

SELECTIVE POLYSILICON STUD GROWTH

CROSS REFERENCE TO RELATED APPLICATIONS

The present application is a division of U.S. patent application Ser. No. 10/056,183, filed Jan. 24, 2002, now U.S. Pat. No. 6,660,584, which is a division of U.S. patent application Ser. No. 09/653,638, filed Aug. 31, 2000, now U.S. Pat. No. 6,380,576, issued Apr. 30, 2002.

This application, which is itself identified below for clarity, is also a member of the following family of related U.S. patent application Ser. No. 09/653,638, filed Aug. 31, 2000, now U.S. Pat. No. 6,380,576; 10/056,183, filed Jan. 24, 2002, now U.S. Pat. No. 6,660,584; 10/209,504, filed Jul. 31, 2002, now U.S. Pat. No. 6,649,962; 10/612,333, filed Jul. 2, 2003; 10/649,507, filed Aug. 22, 2003, now U.S. Pat. No. 6,861,691; 10/933,201, filed Sep. 2, 2004; and 10/986,246, filed Nov. 10, 2004; 11/041,689, filed Jan. 24, 2005; and 11/041,357, filed Jan. 24, 2005.

BACKGROUND OF THE INVENTION

The present invention relates to the fabrication of memory cell arrays and, more particularly, to the formation of a specialized bit line contact in the structure of a DRAM array.

Conventional memory device arrays include word lines running generally in parallel along one direction and bit line pairs running generally in parallel along a perpendicular direction. The memory cell includes a charge storage structure connected by a transistor to one of the bit line pairs. Each transistor is activated by a word line. A row of memory cells is selected upon activation of a word-line. The state of each memory cell in the row is transferred to a bit line for sensing by sense amplifiers, each of which is connected to a pair of bit lines. The memory cell transfer transistors are formed in the substrate in a plurality of continuous active areas running generally in parallel to each other. To form a transistor in an active area, impurity doped regions are formed in the substrate along the length of each active area 24 to create the source and drain of the transistor. A word line forms the gate of the transistor. The transistor formed in the active area provides the pass gate that is controllable to electrically connect the charge storage structure to a bit line. Thus, for example, activation of a word line will cause stored charges to be transferred by corresponding transistors to bit lines. The bit lines are electrically connected to a node of the transistor by bit line contacts.

Conventional bit line contacts are formed through a multi-step deposition and etch back process that increases the complexity of the overall array fabrication process. The process is further complicated because the upper surface of the bit line contact, i.e., the surface that serves as the conductive interface with the bit line, defines a V-shaped profile. Accordingly, there is a need for a memory array fabrication scheme that presents a simplified bit line contact fabrication process.

BRIEF SUMMARY OF THE INVENTION

This need is met by the present invention wherein an improved bit line contact fabrication process is provided. In accordance with one embodiment of the present invention, a memory cell defined along first, second, and third orthogonal dimensions is provided. The first dimension is characterized by one-half of a bit line contact feature, one word line feature, one word line space feature, and one-half of a field poly line feature. The second dimension is characterized by two one-half field oxide features and one active area feature. The first and second dimensions define a $6F^2$ memory cell. The bit line contact feature is characterized by a contact hole bounded by insulating side walls. The contact hole is filled with a conductively doped polysilicon plug defining a substantially convex upper plug surface profile. The storage node contact feature may also comprise a conductively doped polysilicon plug defining a substantially convex upper plug surface profile.

The insulating side walls may comprise a first pair of opposing insulating side walls along the first dimension and a second pair of opposing insulating side walls along the second dimension. The first pair of opposing insulating side walls may comprise respective layers of insulating spacer material formed over a conductive line. The second pair of opposing insulating side walls may comprise respective layers of insulating material formed between respective contact holes. The contact hole may be filled with the polysilicon plug to an uppermost extent of the insulating side walls.

In accordance with another embodiment of the present invention, a memory cell array is provided including a plurality of memory cells, each of the memory cells being defined along first, second, and third orthogonal dimensions. The first dimension is characterized by one-half of a bit line contact feature, one word line feature, one word line space feature, and one-half field poly line feature. The second dimension is characterized by two one-half field oxide features and one active area feature. The first and second dimensions define a $6F^2$ memory cell. The bit line contact feature is characterized by a contact hole bounded by insulating side walls. The contact hole is filled with a conductively doped polysilicon plug defining a substantially convex upper plug surface profile.

In accordance with yet another embodiment of the present invention, a computer system is provided comprising a microprocessor in communication with a memory device including a memory cell array, the memory cell array including a plurality of memory cells, each of the memory cells being defined along first, second, and third orthogonal dimensions. The first dimension is characterized by one-half of a bit line contact feature, one word line feature, one word line space feature, and one-half field poly line feature. The second dimension is characterized by two one-half field oxide features and one active area feature. The first and second dimensions define a $6F^2$ memory cell. The bit line contact feature is characterized by a contact hole bounded by insulating side walls. The contact hole is filled with a conductively doped polysilicon plug defining a substantially convex upper plug surface profile.

In accordance with yet another embodiment of the present invention, a memory cell is provided comprising an electrically conductive word line, an electrically conductive bit line, an electrical charge storage structure, a transistor structure, and a bit line contact. The charge storage structure is conductively coupled to the bit line via the transistor structure and the bit line contact. The transistor structure is conductively coupled to the word line. The bit line contact comprises a conductively doped polysilicon plug formed within a contact hole bounded by insulating side walls. The doped polysilicon plug defines a substantially convex upper plug surface profile in contact with the bit line.

In accordance with yet another embodiment of the present invention, a memory cell array is provided comprising electrically conductive word lines and bit lines, an array of electrical charge storage structures, an array of transistor structures, an array of bit line contacts, and a plurality of sense amplifiers. Each of the charge storage structures is conductively coupled to one of the bit lines via a selected transistor structure and a selected bit line contact. Each of the transistor structures is conductively coupled to one of the word lines. Each of the bit lines are conductively coupled to one of the sense amplifiers. Each of the selected bit line contacts comprises a conductively doped polysilicon plug formed within a contact hole bounded by insulating side walls. Each of the doped polysilicon plugs define a substantially convex upper plug surface profile.

In accordance with yet another embodiment of the present invention, a computer system is provided comprising a microprocessor in communication with a memory device including a memory cell array, the memory cell array including electrically conductive word lines and bit lines, an array of electrical charge storage structures, an array of transistor structures, an array of bit line contacts, and a plurality of sense amplifiers. Each of the charge storage structures is conductively coupled to one of the bit lines via a selected transistor structure and a selected bit line contact. Each of the transistor structures is conductively coupled to one of the word lines. Each of the bit lines are conductively coupled to one of the sense amplifiers. Each of the selected bit line contacts comprises a conductively doped polysilicon plug formed within a contact hole bounded by insulating side walls. Each of the doped polysilicon plugs define a substantially convex upper plug surface profile.

In accordance with yet another embodiment of the present invention a memory cell is provided. The memory cell is defined along first, second, and third orthogonal dimensions and comprises an electrically conductive word line, an electrically conductive bit line, an electrical charge storage structure, a transistor structure, and a bit line contact. The charge storage structure is conductively coupled to the bit line via the transistor structure and the bit line contact. The transistor structure is conductively coupled to the word line. The first dimension is characterized by one-half of a bit line contact feature, one word line feature, one Word line space feature, and one-half of a field poly line feature. The second dimension is characterized by two one-half field oxide features and one active area feature. The first and second dimensions define a $6F^2$ memory cell. The bit line contact feature is characterized by a contact hole bounded by insulating side walls. The insulating side walls comprise a first pair of opposing insulating side walls along the first dimension and a second pair of opposing insulating side walls along the second dimension. The first pair of opposing insulating side walls comprise respective layers of insulating spacer material formed over a conductive line. The second pair of opposing insulating side walls comprise respective layers of insulating material formed between respective contact holes. The contact hole is filled to an uppermost extent of the insulating side walls with a conductively doped polysilicon plug defining a substantially convex upper plug surface profile in contact with the bit line.

In accordance with yet another embodiment of the present invention, a method of manufacturing a memory cell defined along first, second, and third orthogonal dimensions is provided. The method comprises the steps of: forming, along the first dimension, one-half of a bit line contact feature, one word line feature, one word line space feature, and one-half of a field poly line feature; forming, along the second dimension, two one-half field oxide features and one active area feature such that the first and second dimensions define a $6F^2$ memory cell; forming the bit line contact feature such that it is characterized by a contact hole bounded by insulating side walls; and filling the contact hole with a conductively doped polysilicon plug such that the plug defines a substantially convex upper plug surface profile. The step of filling the contact hole is preferably executed through selective growth of doped polysilicon in the contact hole.

In accordance with yet another embodiment of the present invention, a method of manufacturing a memory cell is provided. The memory cell comprises an electrically conductive word line, an electrically conductive bit line, an electrical charge storage structure, a transistor structure, and a bit line contact. The method comprises the steps of: forming the charge storage structure so as to be conductively coupled to the bit line via the transistor structure and the bit line contact; forming the transistor structure so as to be conductively coupled to the word line; forming the bit line contact by forming a conductively doped polysilicon plug within a contact hole bounded, by insulating side walls; and forming the doped polysilicon plug so as to define a substantially convex upper plug surface profile in contact with the bit line. For the purposes of defining and describing the present invention, it is noted that a charge storage structure includes, among other things, a storage node contact structure and a capacitor structure.

In accordance with additional embodiments of the present invention a memory cell and its method of manufacture, according to the present invention, also embodies storage node contacts formed from a conductively doped polysilicon plug defining a substantially convex upper plug surface profile. Accordingly, it is an object of the present invention to provide improved bit line and storage node contacts and an improved bit line and storage node contact fabrication process. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

Figure 1:
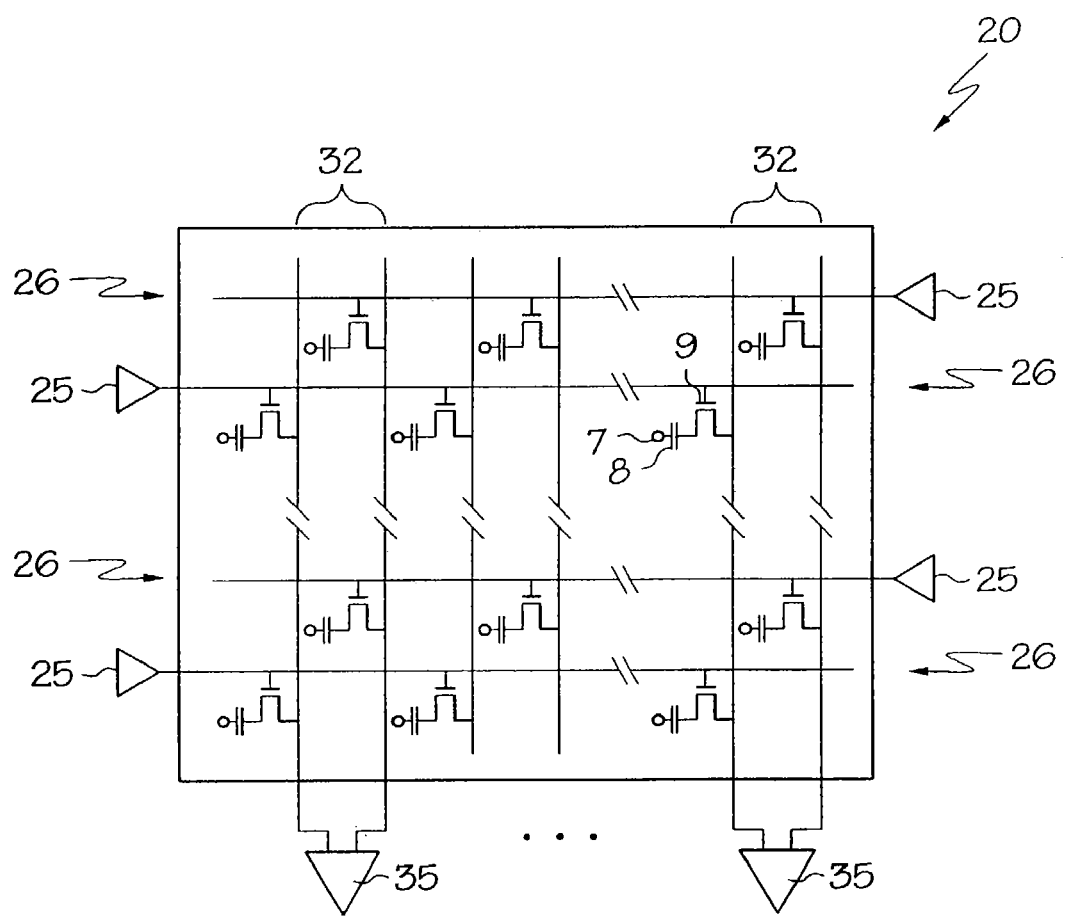
FIG. 1 is a schematic illustration of a memory cell array circuit according to the present invention.

FIG. 1 is a schematic diagram of an exemplary memory array 20 in a memory device that includes word lines 26 running generally in parallel along one direction and bit line pairs 32 running generally in parallel along a perpendicular direction. A memory cell is represented schematically as a capacitor 8, and is connected by a transistor 9 to one of the bit line pairs 32. Each transistor 9 is activated by a word line 26 coupled to a word line driver 25. A row of memory cells 8 is selected upon activation of a word line 26. The state of each memory cell 8 in the row is transferred to a bit line 32 for sensing by sense amplifiers 35, each connected to a pair of bit lines 32. Respective cell plates 7 are illustrated schematically. Typically, as will be appreciated by those practicing the present invention and familiar with memory array structure, the bit lines 32 are twisted in the array 20.

Figure 2:
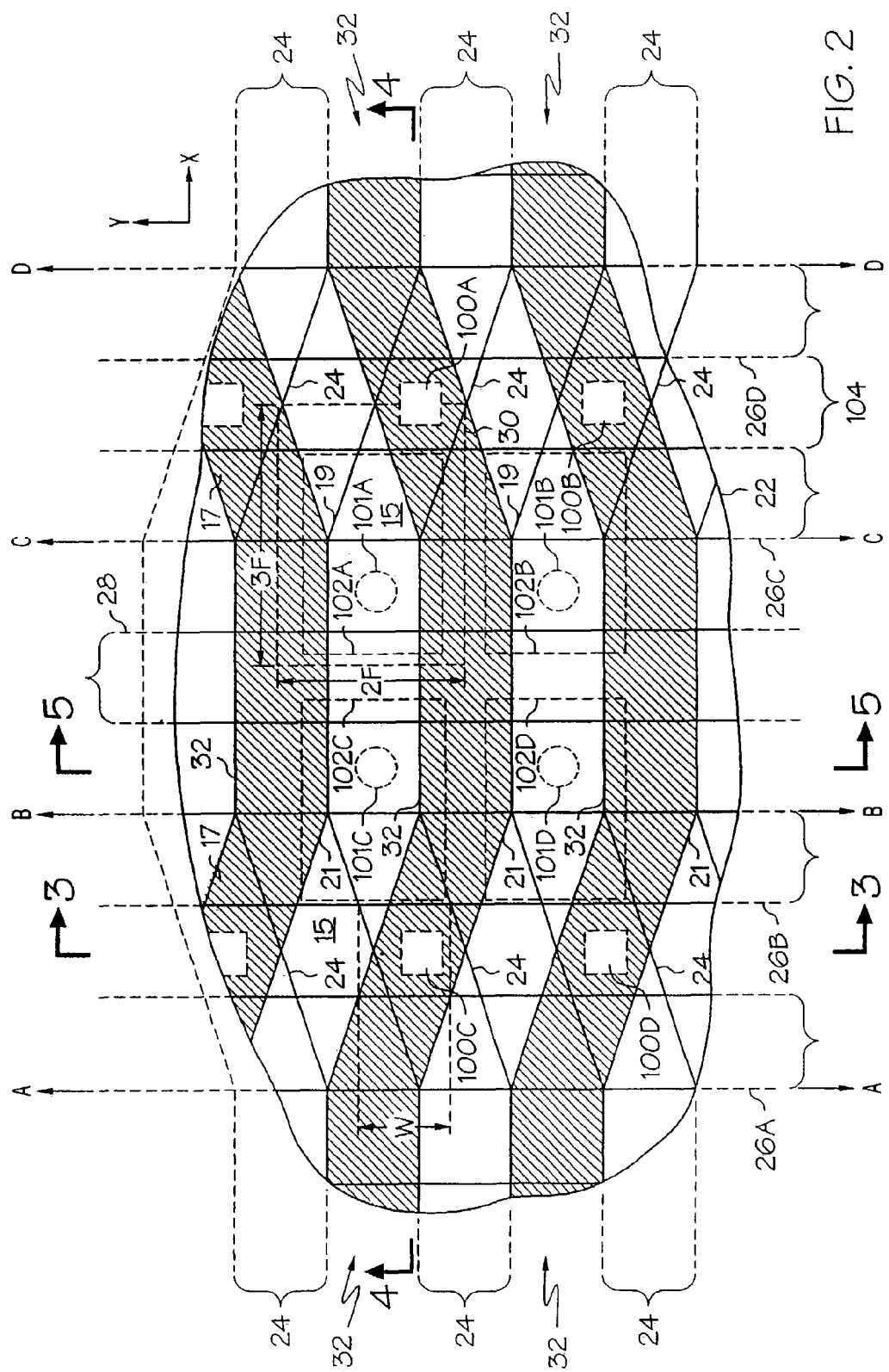
FIG. 2 is a schematic illustration of the physical layout of a memory cell array according to the present invention.

FIG. 2 shows the layout of a portion of the memory array of a semiconductor memory device. In the illustrated embodiment the memory device is a dynamic random access memory or DRAM. Other types of memory devices include synchronous DRAMs, video RAMs, or other modified versions of the DRAM. The memory array 20 includes a semiconductive substrate 22. As used in this document, a semiconductive substrate is defined to mean any construction comprising semiconductive material, including bulk semiconductive materials such as a semiconductive wafer, either alone or in assemblies comprising other materials thereon, and semiconductive material layers, either alone or in assemblies comprising other materials. The term substrate refers to any supporting structure, including the semiconductive substrates described above.

The memory cell transfer transistors 9 are formed in the substrate 22 in a plurality of continuous active areas 24 running generally in parallel to each other. Each active area 24 is defined between isolation regions 34 disposed relative to the substrate 22 (see FIG. 3). To form a transistor in an active area, impurity doped regions are formed in the substrate along the length of each active area 24 to create the source and drain of the transistor. A word line 26 forms the gate of the transistor 9.

The transistor 9 formed in the active area 24 provides the pass gate that is controllable to electrically connect a cell capacitor 102A, 102B, 102C, and 102D to a bit line 32 via a storage node contact 101A, 101B, 101C. 101D (see FIG. 2). Thus, for example, activation of a word line 26C will cause the stored charges from the capacitors 102A and 102B to be transferred by corresponding transistors 9 to bit lines 32, which are electrically connected to a node (the source or drain) of the transistor by bit contacts 100A, 100B, 100C, 100D. Although depicted as circles or squares in FIG. 2, the contacts 100, 101 can be of different shapes, and can take up the entire area of intersection between the bit lines 32 and the active area lines 24.

For clarity, each illustrated continuous active area line 24 has been shown to extend to outside of the boundary of substrate 22 utilizing dashed lines. Each individual active area is designated separately as 24', 24", and 24'". To reduce the effective memory cell area while still maintaining ease of manufacture as discussed below, the continuous active areas 24', 24", and 24'" are not straight or linear, but rather weave relative to the substrate within which they are formed such that bends are created in each active area line 24. The illustrated individual continuous active area lines extend generally horizontally across the page upon which FIG. 2 appears, but jog upwardly as depicted in FIG. 2 to form protruding portions 19. This jogging is repeated along the length of the active area line 24.

Similarly, the bit lines 32, which are formed above the active area lines 24, also weave relative to the substrate 22 such that depressed portions 21 are formed in the bit lines. The bit lines 32 run generally along the same direction as the active areas 24, but the direction of the jog in the bit lines 32 is opposite to the jog of the active area lines 24. The jogging of the bit lines and active area lines form slanted portions 17 and 15, respectively. The bit contacts 100 are formed at the intersections of the bit lines 32 and the active area lines 24. Since the bit lines 32 and active area lines 24 are slanted with respect to each other in the region of each intersection, formation of the contact hole in which the bit contact 100 is formed is made easier. This is because of the increase in width W of the contact hole as compared to the width if both the active area lines 24 and bit lines 32 are generally straight. This difference in contact hole width becomes more important as the feature size of memory cells continues to decrease because contact holes with greater widths are generally more reliable.

As depicted in FIG. 2, each of the bit lines 32 and active area lines 24 run generally along the X direction. The jogs in the bit lines and active area lines are formed at predetermined locations A-A, B-B, C-C, and D-D. At A-A, each active area line 24 bends upwards while each bit line 32 bends downwards. The angle of the bend can be set at, for example, about 18.5°, although other angles are also possible. In addition, the directions of the active area and bit lines jogs can be switched. As further shown in FIG. 2, at B-B, each of the active area and bit lines bend back in the opposite directions of the corresponding bends at A-A such that both the active area and bit lines run again generally along the X direction. At C-C the active area and bit lines bend again, also in the opposite directions from the corresponding bends at A-A. At D-D, the lines bend back again to run generally in the X direction. One advantage of weaving both the active area and bit lines in the array is that a smaller bend angle is required for the repeated jogs while still achieving the desired memory cell area reduction.

A plurality of conductive lines 26, 28 are formed under the bit lines 32 and run generally perpendicularly to the active area 24 and bit lines 32. In the illustrated example, four of the conductive lines are word lines 26 and one of the conductive lines 28 is grounded to provide isolation between storage nodes. A pair of conductive lines 26A, 26B, 26C, 26D may be seen on either side of conductive line 28 (see FIG. 2). The active area lines 24 and conductive lines 26, 28 constitute or define an array over which a plurality of memory cells are formed.

The area which is consumed by a single memory cell in accordance with this embodiment is illustrated by dashed outline 30. This memory cell area can be described with reference to its feature size F. The feature size is based on the width L of the electrically conductive lines in the array, and on the width S of the isolation space between the conductive lines. The sum of L and S is the minimum pitch of the memory cell. The feature size F is half the minimum pitch, or half the sum of L and S. As is illustrated in FIG. 2, the memory cell 30 comprises a single memory cell that is about 3F wide (one-half bit line contact feature, one word line feature, one word line space feature, and one-half field poly line feature) by about 2F high (two one-half field oxide features and one active area feature), thus providing a consumed area for a single memory cell of about $6F^2$. In one implementation, F is no greater than 0.25 micrometer, and preferably, no greater than 0.18 micrometer. However, other dimensions, either larger or smaller, are also contemplated. It is noted that it is commonplace in the art of semiconductor fabrication to refer to a bit line and a digit line interchangeably.

In one implementation, adjacent word lines 26 share an intervening bit contact 100 of adjacent pairs of memory cells as will become apparent below. For example, as shown in FIG. 2, word lines 26C and 26D share bit contacts 100A and 100B. Electrical isolation between the adjacent pairs of memory cells is provided by intervening conductive line 28. Line 28, in operation, is connected with ground or a suitable negative voltage. Alternatively, the electrical isolation can be provided by field oxide.

Figure 3:
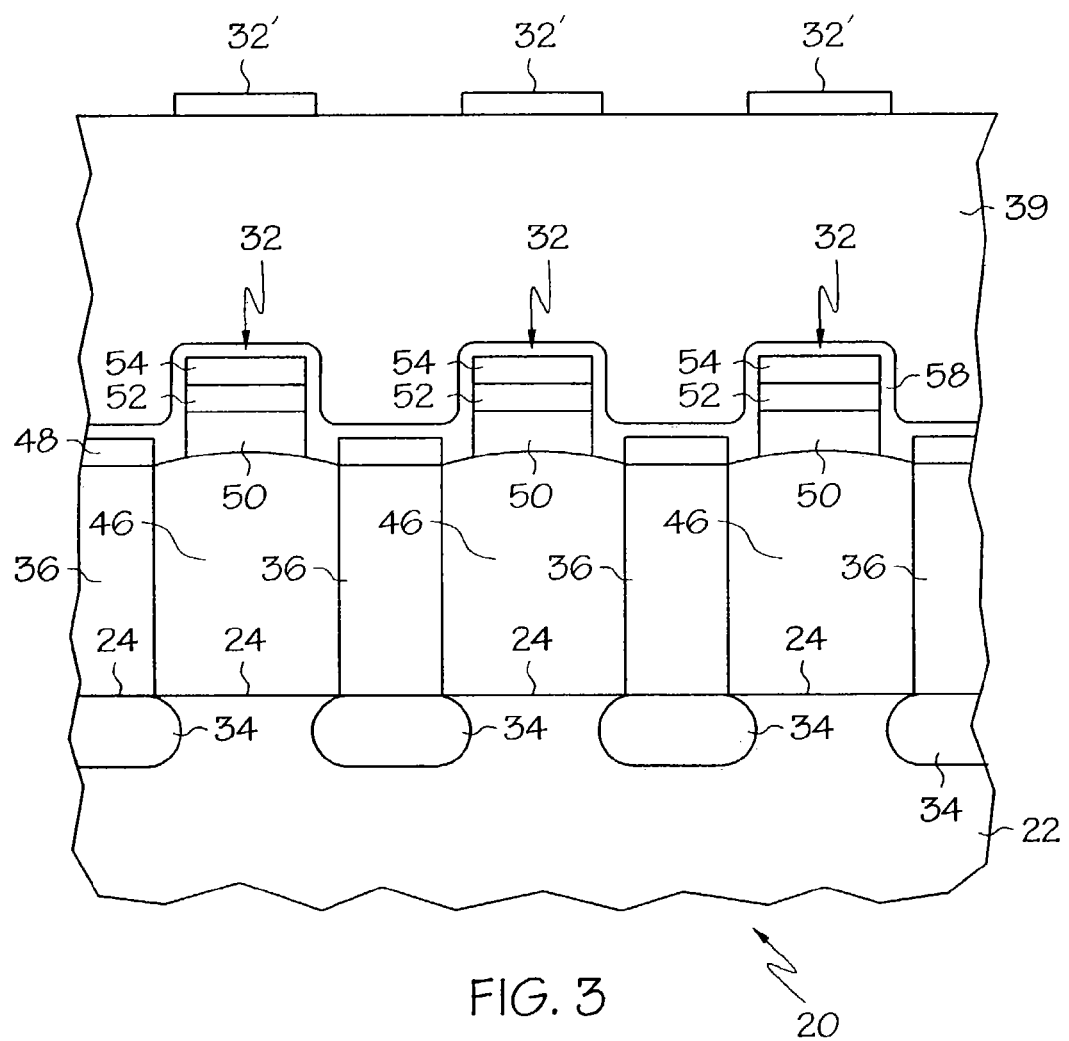
FIG. 3 is a cross sectional view of the physical layout of FIG. 2, taken along line 3-3 of FIG. 2.
Figure 4:
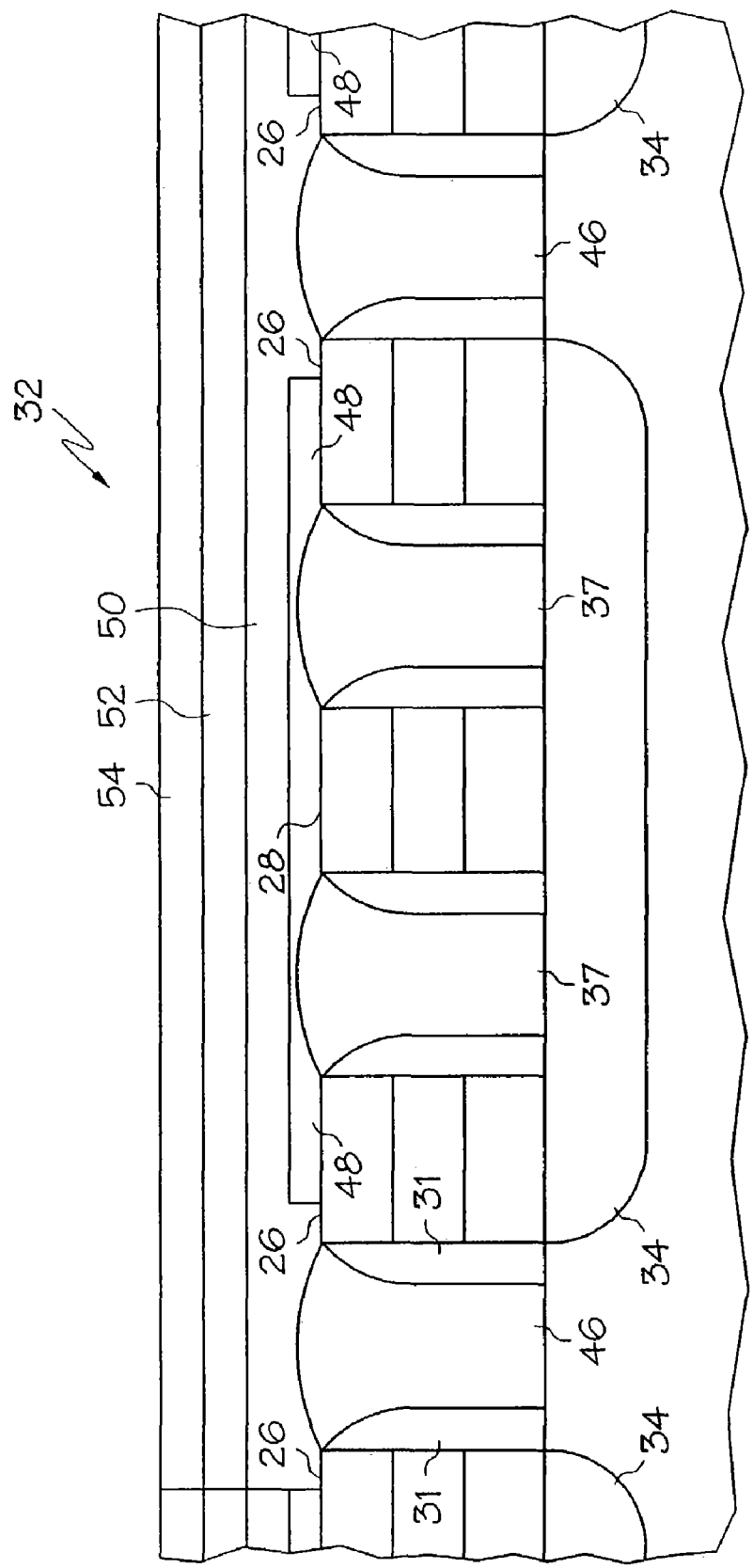
FIG. 4 is a cross sectional view of the physical layout of FIG. 2, taken along line 4-4 of FIG. 2.
Figure 5:
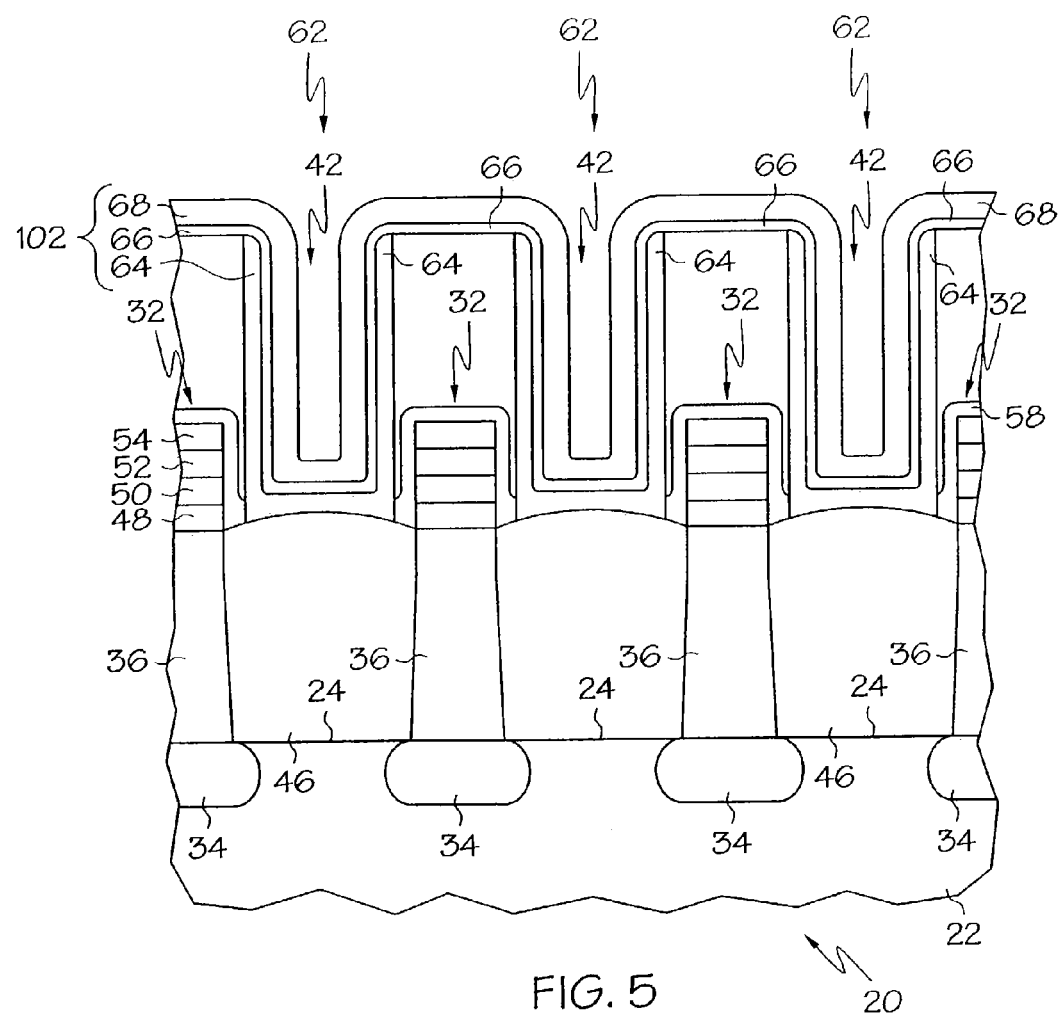
FIG. 5 is a cross sectional view of the physical layout of FIG. 2, taken along line 5-5 of FIG. 2.

Cross-sectional views of the memory array 20 of FIG. 2 are shown in FIGS. 3, 4, and 5, which are cross-sections taken along lines 3-3, 4-4, and 5-5, respectively. Referring to FIGS. 2-5, the bit contacts 100 comprise an electrically conductive plug 46 made of a conductively doped polysilicon and electrically connect the bit lines 32 to the underlying active areas 24. The storage node contacts 101 also comprise an electrically conductive plug 37 made of a conductively doped polysilicon. The bit contacts 100 are located in the space 104 between two adjacent word lines 26. The memory cell capacitors 102 are electrically contacted to the active areas 24 via the electrically conductive plugs 37.

In FIG. 3, the active areas 24 are defined in the substrate 22. The electrically conductive plugs 46 are disposed above and in electrical contact with portions of the active areas 24. The bit lines 32 are conventional electrically conductive multilayer structures formed from conventional materials and typically comprise, for example, a conductive layer 50, a conductive barrier layer 52, and an insulator 54. The bit lines 32 are disposed above and in electrical contact with the bit line contact plugs 46. A layer of insulating spacer material 58 is formed over the multilayer structures to electrically insulate exposed portions of the multilayer structures.

Referring to FIG. 4, an enlarged-view of the array taken generally along line 4-4 in FIG. 2 is shown. The bit line 32 overlies conductive lines 26, 28 and associated isolation oxide regions 34 and insulating regions 48. Bit line 32 can also be seen to be in electrical communication with the two illustrated plugs 46. The storage node plugs 37 are also illustrated in FIG. 4.

In FIG. 5, the cell capacitors 102 are illustrated. Each capacitor 102 is formed of a first capacitor plate 64, a dielectric layer 66, and a second capacitor plate 68. The first capacitor plate 64 of each cell is electrically contacted to the plug 46 for electrical connection to the active area 24. The cell capacitor structure is laid over the bit line structure, which forms a cell-over-bit line (COB) array structure. An advantage the COB structure offers is that bit line contact openings need not be made in the second capacitor plate 68, which eliminates difficulties associated with aligning bit line contact openings in the second plate 68 to cell structures or word lines in the array and allows for maximization of the cell capacitor area, as is illustrated in FIG. 2 (see 102A, 102B, 102C, 102D). The bit line structure is referred to as a buried bit line and corresponds to the bit line 32 in FIG. 2.

Referring again to FIG. 2, the memory array structure of the present invention includes a plurality of memory cells 30. As is described above, each of the memory cells 30 comprises a $6F^2$ memory cell defined along three orthogonal dimensions, two of which are indicated in FIG. 2 (see X, Y). As is illustrated in FIGS. 3, 4, and 5, the bit line contact feature of the memory cell 30 is characterized by a contact hole bounded by insulating side walls. Specifically, the insulating side walls comprise a first pair of opposing insulating side walls 31 along the first dimension X and a second pair of opposing insulating side walls 36 along the second dimension Y. The first pair of opposing insulating side walls 31 comprise respective layers of insulating spacer material formed over the word lines 26. The second pair of opposing insulating side walls 36 comprise respective layers of insulating material formed between respective contact holes. The contact holes are filled with the conductively doped polysilicon plug 46. The plug is formed so as to define a substantially convex upper plug surface profile in contact with the bit line 32. The upper plug surface profile is described herein as substantially convex because it is contemplated that the profile may vary from a uniformly pure convex profile. Specifically, the profile may include irregularities in the form of bumps or pits and may include portions that are not convex. For the purposes of defining and describing the present invention, it is noted that a "substantially convex" plug profile includes a portion within the interior of its periphery that extends beyond a plane defined by the periphery of the plug. It is further contemplated by the present invention that, in certain embodiments, it may be sufficient to form a plug profile that is substantially flat. Accordingly, for the purposes of defining and describing the present invention, it is noted that a "substantially convex" plug profile also includes any plug profile that is essentially flat or free of significant concavities.

Preferably, the contact holes are filled with the conductively doped polysilicon plug 46 to an uppermost extent of the insulating side walls 36 in a selective doped polysilicon growth process. The storage node plugs 37 may be formed in a similar manner. It is contemplated by the present invention that the contact holes may initially be partially filled via conventional deposition techniques and subsequently topped off via a selective doped polysilicon growth process according to the present invention. For example, a contact hole may initially be filled by depositing polysilicon in a conventional manner, etching back the deposited polysilicon, and subsequently executing a selective doped polysilicon growth process according to the present invention to yield the convex plug profile of the present invention.

Advancement in deposition systems has enabled selective growth of polysilicon films. In selective growth, films are grown through holes in films of silicon dioxide, silicon nitride, oxynitride, or any insulator material that inhibits silicon growth. The wafer at issue is positioned in a reactor chamber and the film grows directly on the silicon exposed on the bottom of the hole. As the film grows, in the insulating side wall contact hole structure of the present invention, it assumes the substantially convex upper plug surface profile illustrated in FIGS. 3-5. As will be appreciated by those practicing the present invention and familiar with the art of semiconductor device fabrication, a variety of polysilicon growth techniques may be utilized to form the substantially convex upper plug surface profile of the present invention. For example, according to one embodiment of the present invention, the polysilicon plug 46 may be grown by using a silicon source of silane or disilane at a temperature of about 500° C. and a pressure of about 100-200 mT. The polycrystalline silicon may be n-type or p-type and may be doped with conventional n or p-type dopants, including arsenic, phosphorous, boron, indium, etc.

In one embodiment, a "double deck" bit line architecture is used, which includes the buried bit line and a top deck bit line 32' formed above the buried bit lines 32 and the capacitors 102. (see FIG. 3). As shown in FIG. 3, an insulating layer 39 is formed between the top deck bit line 32' and the underlying structure. The top deck bit line 32' is generally formed of a metal, such as aluminum. The top deck bit lines 32' do not make contact with the memory array. Contact to the memory array transistors are made by the buried bit lines 32.

By using the double deck bit line structure, the bit lines 32, 32' can be connected to the sense amplifiers 35 in a folded bit line configuration. Thus, by using the double deck bit lines, the $6F^2$ memory cell described in this application can be used in a folded bit line memory configuration. One advantage of the folded bit line configuration is that it is less susceptible to charge coupling between bit lines. Because a bit line pair is connected to each sense amplifier 35 on the same side of the sense amplifier, noise created by alpha particles will couple to both of the bit lines in the pair. As the sense amplifier 35 detects the difference in voltage between the pair of bit lines, errors due to such noise effects, commonly referred to as common mode rejection, are reduced.

Figure 6:
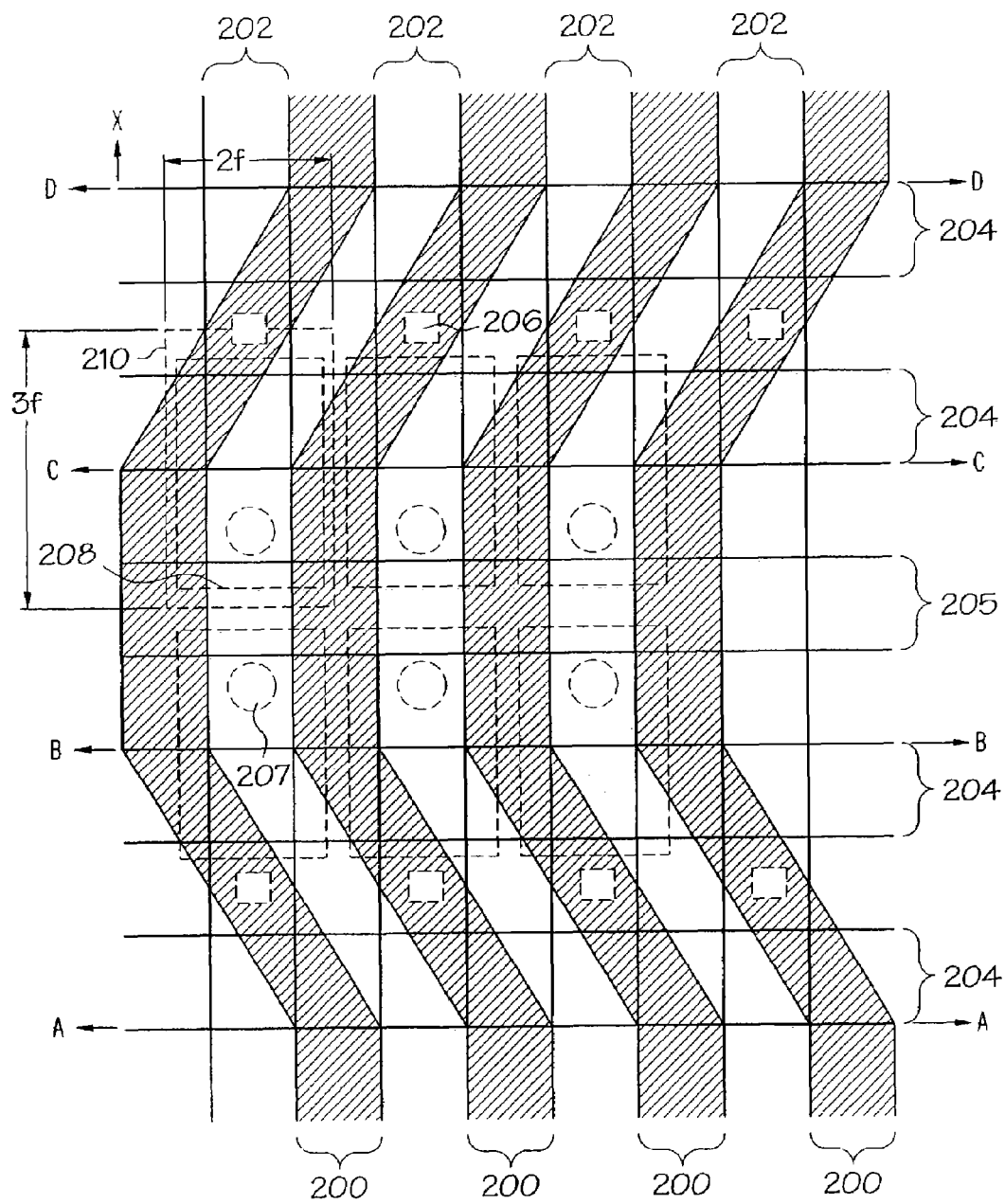
FIG. 6 is a schematic illustration of an alternative physical layout of a memory cell array according to the present invention.

Referring to FIG. 6, an alternative embodiment of an array containing reduced size memory cells (e.g., $6F^2$ cells) is shown. In this configuration, bit lines 200 are formed to weave relative to the substrate 20, while continuous active area lines 202 are generally straight. Bit contacts 206 are formed at the intersections between the bit lines 200 and active area lines 202. In addition, memory cell capacitors 208 are formed over and are in electrical contact with portions of the active area lines 202 via storage node contacts 207.

As illustrated, each bit line 200 runs generally in the X direction and jogs or protrudes upwardly in a repeated pattern. Each bit line 200 bends upwardly at A-A at an angle of about 45° with respect to the X axis. The bit line 200 then bends in the opposite direction at B-B so that it runs generally in the X direction. After a short run, the bit line 200 then bends downwardly at C-C. At D-D, the bit line 200 again bends back to run generally in the X direction. This pattern is repeated throughout the memory array. As indicated by the dashed outline 210, the feature size of the memory cell in this configuration is also about $6F^2$. Conductive lines 204, 205 run generally perpendicularly to the active areas 202. The conductive lines 204 form the word lines in the array while the lines 205 are grounded or driven to a negative voltage to provide electrical isolation between word lines 204. It is contemplated by the present invention that an additional alternative memory cell configuration may utilize straight bit lines and active area lines that weave relative to the bit lines. In this embodiment, continuous active areas would run generally in the X direction and have repeated downward jogs, creating weaving continuous active areas. Active areas may be defined by isolation regions relative to a substrate, which initially is on a flat surface of a wafer. Because of the flatness, the bends in the active areas do not create as many photolithographic difficulties as with bit lines, which generally run over relatively rough terrain since the bit lines make contact to the active area surface in some portions and are isolated from active areas where the cell capacitors are formed.

Having described the invention in detail and by reference to preferred embodiments thereof, it will be apparent that modifications and variations are possible without departing from the scope of the invention defined in the appended claims. For example, although much of the present invention is illustrated with reference to folded bit line structure, it is noted that the present invention is applicable to open bit line architecture as well.

What is claimed is:

1. A method of manufacturing a memory cell comprising an electrically conductive word line, an electrically conductive bit line, an electrical charge storage structure, a transistor structure, and a bit line contact, said method comprising the steps of:

forming said charge storage structure so as to be conductively coupled to said bit line via said transistor structure and said bit line contact;

forming said transistor structure so as to be conductively coupled to said word line;

forming said bit line contact by forming a conductively doped polysilicon plug within a contact hole bounded by insulating side walls; and forming said doped polysilicon plug so as to define an upwardly curved upper plug surface profile in contact with said bit line, wherein said upwardly curved upper plug surface profile extends from an uppermost extent of one insulating side wall to an uppermost extent of an opposing insulating side wall such that said upwardly curved upper plug surface profile is at least partially above the opposing insulating side walls.

2. A method of manufacturing a memory cell as claimed in claim 1 wherein said insulating side walls are formed so as to comprise a first pair of opposing insulating side walls along a first dimension and a second pair of opposing insulating side walls along a second dimension.

3. A method of manufacturing a memory cell as claimed in claim 2 wherein said first pair of opposing insulating side walls are formed so as to comprise respective layers of insulating spacer material formed over a conductive line.

4. A method of manufacturing a memory cell as claimed in claim 2 wherein said second pair of opposing insulating side walls are formed so as to comprise respective layers of insulating material formed between respective contact holes.

5. A method of manufacturing a memory cell as claimed in claim 1 wherein said contact hole is filled with said polysilicon plug to an uppermost extent of said insulating side walls.

* * * * *

UNITED STATES PATENT AND TRADEMARK OFFICE
CERTIFICATE OF CORRECTION

PATENT NO. : 7,300,839 B2
APPLICATION NO. : 10/612333
DATED : November 27, 2007
INVENTOR(S) : Tran It is certified that error appears in the above-identified patent and that said Letters Patent is hereby corrected as shown below:

On the title page, item (56), under "Other Publications", in column 2, line 1, delete "um2" and insert -- $um^2$ --, therefor.

On the title page, item (57), under "Abstract", in column 2, line 12, delete "may is" and insert -- may be --, therefor.

Signed and Sealed this

Eighth Day of April, 2008

JON W. DUDAS
*Director of the United States Patent and Trademark Office*